(12) United States Patent
Chang (10) Patent No.: US 12,125,826 B2
(45) Date of Patent: Oct. 22, 2024

(54) WAFER-LEVEL STACKED DIE STRUCTURES AND ASSOCIATED SYSTEMS AND METHODS

(71) Applicant: Micron Technology, Inc., Boise, ID (US)

(72) Inventor: Chih Yuan Chang, New Taipei (TW)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/819,036

(22) Filed: Aug. 11, 2022

(65) Prior Publication Data

US 2022/0384393 A1    Dec. 1, 2022

Related U.S. Application Data

(62) Division of application No. 16/721,670, filed on Dec. 19, 2019, now Pat. No. 11,444,059.

(51) Int. Cl.
| | |
|---|---|
| *H01L 25/065* | (2023.01) |
| *H01L 21/56* | (2006.01) |
| *H01L 23/00* | (2006.01) |
| *H01L 23/31* | (2006.01) |
| *H01L 23/498* | (2006.01) |
| *H01L 25/00* | (2006.01) |

(52) U.S. Cl.
CPC .......... *H01L 25/0657* (2013.01); *H01L 21/56* (2013.01); *H01L 23/3128* (2013.01); *H01L 23/49816* (2013.01); *H01L 24/32* (2013.01); *H01L 25/50* (2013.01); *H01L 2224/32145* (2013.01); *H01L 2225/06548* (2013.01); *H01L 2225/06562* (2013.01)

(58) Field of Classification Search
CPC ................ H01L 25/0657; H01L 24/32; H01L 2225/06562; H01L 2225/06548; H01L 2224/32145
See application file for complete search history.

(56) References Cited

U.S. PATENT DOCUMENTS

| | | | | |
|---|---|---|---|---|
| 5,721,452 A | * | 2/1998 | Fogal | H01L 24/49 257/723 |
| 6,051,886 A | * | 4/2000 | Fogal | H01L 25/0657 257/784 |
| 6,359,340 B1 | * | 3/2002 | Lin | H01L 25/0657 257/784 |

(Continued)

*Primary Examiner* — Jarrett J Stark
(74) *Attorney, Agent, or Firm* — Perkins Coie LLP (57) ABSTRACT

A stacked die structure for a semiconductor device generally includes a primary level with a first die formed in a wafer, and a second level with a second die coupled to the first die. A third level includes a third die coupled to the second die. The levels have conductive first, second, and third interconnects, respectively, extending from active sides of the dies and may be bonded prior to stacking the dies. The dies may be stacked in an offset or rotated position relative to each other such that the interconnects extend beyond each of the other dies to contact a redistribution layer that forms electrical connections with external components. In some configurations, a fourth level having a fourth die and a conductive fourth interconnect is coupled to the third die and positioned laterally offset from the third die such that the third interconnect extends beyond the fourth die.

15 Claims, 10 Drawing Sheets

(56) References Cited

U.S. PATENT DOCUMENTS

| | | | |
|---|---|---|---|
| 6,388,313 B1* | 5/2002 | Lee | H01L 25/0657 257/723 |
| 6,650,006 B2* | 11/2003 | Huang | H01L 23/3121 257/E23.125 |
| 7,777,348 B2* | 8/2010 | Kodama | H01L 24/06 257/723 |
| 7,825,520 B1* | 11/2010 | Longo | H01L 25/0657 257/777 |
| 8,288,854 B2* | 10/2012 | Weng | H01L 23/49816 361/679.01 |
| 8,558,392 B2* | 10/2013 | Chua | H01L 23/13 257/676 |
| 9,159,716 B2* | 10/2015 | Hsu | H01L 23/36 |
| 9,293,443 B2 | 3/2016 | Nam | |
| 9,679,882 B2 | 6/2017 | Tung et al. | |
| 9,853,015 B1* | 12/2017 | Fan | H01L 25/0652 |
| 9,985,002 B2* | 5/2018 | Lee | H01L 24/17 |
| 10,026,717 B2* | 7/2018 | Uzoh | H01L 25/16 |
| 10,177,119 B2* | 1/2019 | Zhang | H01L 24/14 |
| 10,381,326 B2* | 8/2019 | Woychik | H01L 24/02 |
| 10,600,679 B2 | 3/2020 | Kim et al. | |
| 2010/0193930 A1* | 8/2010 | Lee | H01L 24/24 257/E23.173 |
| 2010/0265751 A1* | 10/2010 | Hong | G11C 5/06 257/E23.141 |
| 2011/0304044 A1* | 12/2011 | Lin | H01L 25/0657 257/E21.705 |
| 2012/0104623 A1* | 5/2012 | Pagaila | H01L 23/13 257/E21.503 |
| 2013/0009303 A1* | 1/2013 | Tsai | H01L 25/0657 257/737 |
| 2015/0076700 A1* | 3/2015 | Yap | H01L 25/105 257/773 |
| 2015/0206865 A1* | 7/2015 | Yu | H01L 23/3107 257/737 |
| 2015/0262928 A1* | 9/2015 | Shen | H01L 21/76879 257/676 |
| 2015/0380377 A1* | 12/2015 | Uzoh | B81C 1/0023 257/773 |
| 2018/0151538 A1* | 5/2018 | Hung | H01L 25/50 |
| 2019/0279919 A1* | 9/2019 | Xu | H01L 25/0652 |
| 2020/0105719 A1* | 4/2020 | Li | H01L 25/50 |
| 2020/0203282 A1* | 6/2020 | Shih | H01L 23/5383 |
| 2020/0212012 A1* | 7/2020 | Meyers | H01L 23/13 |
| 2021/0193621 A1 | 6/2021 | Chang | |
| 2021/0249380 A1* | 8/2021 | Chen | H01L 25/105 |
| 2021/0249384 A1* | 8/2021 | Kim | H01L 28/40 |
| 2021/0305173 A1* | 9/2021 | Huang | H01L 25/50 |

* cited by examiner

WAFER-LEVEL STACKED DIE STRUCTURES AND ASSOCIATED SYSTEMS AND METHODS

CROSS-REFERENCE TO RELATED APPLICATION

This application is a divisional of U.S. patent application Ser. No. 16/721,670, filed Dec. 19, 2019, which is incorporated by reference herein in its entirety.

TECHNICAL FIELD

The present disclosure is generally directed to semiconductor devices, and in several embodiments, more particularly to wafer-level stacked die structures.

BACKGROUND

Microelectronic devices, such as memory devices, microprocessors, and light emitting diodes, typically include one or more semiconductor dies mounted to a substrate and encased in a protective covering. The semiconductor dies include functional features, such as memory cells, processor circuits, interconnecting circuitry, etc. Semiconductor die manufacturers are under increasing pressure to reduce the volume occupied by semiconductor dies while increasing the capacity and/or speed of the resulting encapsulated assemblies. To meet these and other demands, semiconductor die manufacturers often stack multiple semiconductor dies vertically on top of each other to increase the capacity or performance of a microelectronic device within the limited volume on the circuit board or other element to which the semiconductor dies are mounted. Individual or stacked semiconductor dies can be electrically coupled to a substrate using gold wire loops.

Conventional semiconductor device configurations have a semiconductor substrate electrically coupled to a component, such as a printed circuit board (PCB), using one or more solder balls. The substrate carries semiconductor dies attached to each other with pieces of a die attach film to form the semiconductor device. Some conventional semiconductor devices have a first primary level die and a second primary level die electrically coupled to the semiconductor substrate using primary wire loops (e.g., wirebonds). Additionally, the semiconductor device can further include a first secondary level die and a second secondary level die electrically coupled to the substrate using wire secondary wire loops. The height of the semiconductor die stack is generally limited based on height restrictions of the primary and/or secondary wire loops.

DETAILED DESCRIPTION

The technology disclosed herein relates to semiconductor devices, systems with semiconductor devices, and related methods for manufacturing semiconductor devices. The term "semiconductor device" generally refers to a solid-state device that includes one or more semiconductor materials. Examples of semiconductor devices include logic devices, memory devices, and diodes, among others. Furthermore, the term "semiconductor device" can refer to a finished device or to an assembly or other structure at various stages of processing before becoming a finished device.

Depending upon the context in which it is used, the term "substrate" can refer to a structure that supports electronic components (e.g., a die), such as a wafer-level substrate, a singulated die-level substrate, or another die for die-stacking applications. A person having ordinary skill in the relevant art will recognize that suitable steps of the methods described herein can be performed at the wafer-level or at the die level. Furthermore, unless the context indicates otherwise, structures disclosed herein can be formed using conventional semiconductor-manufacturing techniques. Materials can be deposited, for example, using chemical vapor deposition, physical vapor deposition, atomic layer deposition, spin coating, plating, and/or other suitable techniques. Similarly, materials can be removed, for example, using plasma etching, wet etching, chemical-mechanical planarization, or other suitable techniques.

The present technology includes stacked die structure packaging configurations. The figures and description herein relate to wafer-level packaging of stacked die structures, e.g., Package on Package (PoP), but the present technology is suitable for use with other packaging levels. In contrast to the present technology, conventional semiconductor die stacks using wire loop electrical connections have limited configurations based on length limitations of the gold material forming the wire loops. The gold wire loops generally do not allow reliable electrical connections between the substrate and the upper dies of a die stack having more than two dies. In conventional configurations, the use of gold wire loops can also limit the manufacturing process options, and may require additional time and specialized tools for processing. As the size and spacing of the semiconductor packages become smaller and tighter, embodiments of the present technology allow closer package spacing with greater die density in higher stacked configurations.

Semiconductor devices formed in accordance with the present technology may generally include a primary level having a first die and an electrically conductive first interconnect. The first die has a backside and an active side opposite the backside, and the first interconnect extends from the active side of the first die. The semiconductor device also has a second level with a second die and an electrically conductive second interconnect. The second die has an active side and a backside, and the second interconnect extends from the active side of the second die. The backside of the second die is mounted to the active side of the first die such that the second interconnect extends in the same direction as the first interconnect. The second die may be offset from the first die in a lateral direction along the active side of the first die such that the first interconnect extends beyond the active side of the mounted second die.

The semiconductor devices may be assembled by forming the first die of the primary level in a wafer and connecting the first interconnect to the first die such that the first interconnect extends from the active side of the first die. The second die can be formed separately, and the second interconnect is connected to the active side of the second die. After connecting the first and second interconnects to their respective dies, the backside of the second die is mounted the active side of the first die such that the first interconnect extends beyond the active side of the second die. In an assembled configuration, the second conductive interconnect extends in the same direction as the first conductive interconnect. Manipulating and stacking the dies with the interconnects already connected to the dies may require smaller vacuum bond tips and/or grasping edges of the dies that do not have interconnects.

Configurations of the present technology are suitable for use with a variety of semiconductor die packages, including static random access memory (SRAM), dynamic random access memory (DRAM), NOT-AND gate (NAND) flash memory, application-specific integrated circuits (ASIC), microcontrollers (uC), and/or other memory and semiconductor devices. The present technology may be used in ultra thin die (typically having a wafer thickness below 50 micrometers (μm)) and ultra thin bond line (typically having a die attach film (DAF) with a bond thickness at or below 10 μm) multichip package applications and other applications. In some embodiments, a substrate for connecting to the PCB or other component may be omitted to reduce the package size (about 80-100 μm) and/or save cost. The illustrated die stacking configurations of FIGS. 1A-6 are examples of the present technology, and the dies shown and described may have different thicknesses, quantities, profiles, and aspect ratios to create the desired stacking configurations. The illustrated conductive interconnect configurations are also examples and may have different quantities, lengths, and/or placement to electrically connect the dies within the package.

The interconnect structures of the dies described herein are generally pillars or pins formed from suitable conductive materials, such as copper (Cu) or gold (Au). The interconnect structures may be connected to solder caps to form the electrical connections (e.g., tin-silver (SnAg) solder caps). The interconnect structures can be electrically connected to a redistribution layer (RDL) by reflowing the solder caps using gang reflow, sonic reflow, or other techniques. In some embodiments, the interconnect structures are formed prior to stacking the dies on each other and may be formed using single or multiple mask processing techniques. Alternatively, the interconnect structures may be formed after stacking the dies (e.g., with copper wire vertical bonding, etc.). The bond pads on the dies to which the interconnect structures are connected are typically copper pads such that copper pillars or pins are coupled to the bond pads using copper-to-copper bonding. In other embodiments, the interconnect structures can be formed from a different material than the bond pad, or they can be formed from a combination of materials.

Figure 1A:
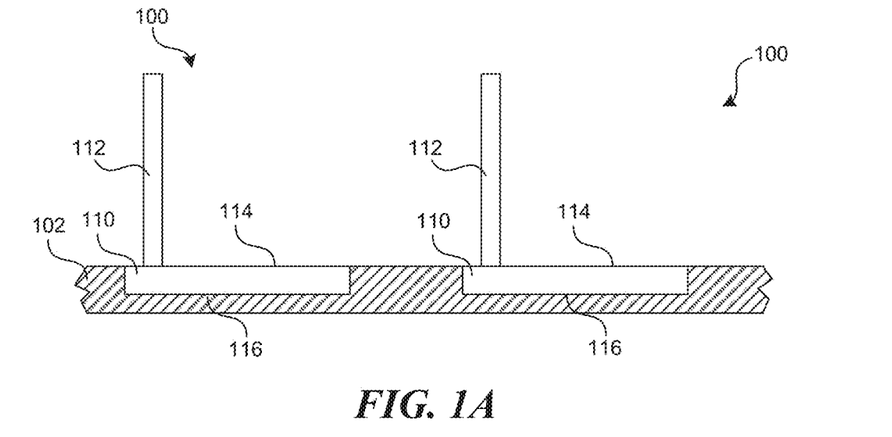
FIG. 1A is an enlarged cross-sectional front elevation view and FIG. 1B is an enlarged cross-sectional plan view showing a primary level stage of forming a stacked die structure in accordance with the present technology.
Figure 1B:
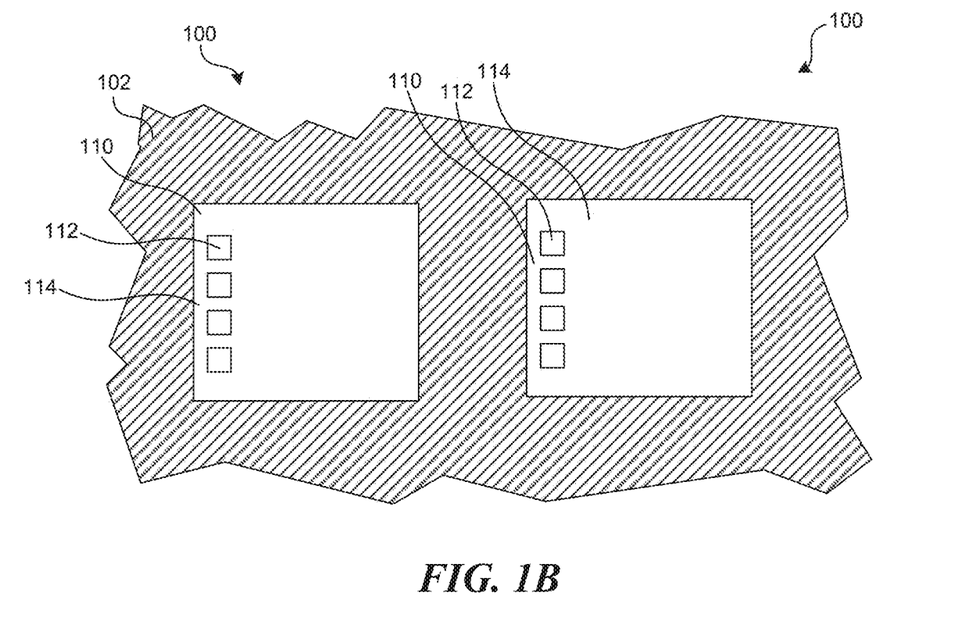

FIGS. 1A and 1B show a primary level of stacked die structures 100 in accordance with an embodiment of the present technology. The primary level of the stacked die structures 100 has first dies 110 that each include an active side 114 and a backside 116. As shown, the first dies 110 are formed in a common wafer 102 (e.g., a single semiconductor wafer). In other embodiments, any number of stacked die structures are suitably formed in a single wafer. In the ensuing description, the stacked die structures 100 are examples of multiple-die structures formed in accordance with embodiments the present technology. In other embodiments, adjacent stacked die structures on a wafer may have different stacking configurations to each other, or to other dies on the wafer. The scribe lines between the first dies may be wider than conventional scribe lines to provide dicing clearance between the die stacks after assembly, while scribe lines between second, third, and fourth levels, described below, may have conventional width scribe lines on the same wafer or on a secondary wafer.

The first dies 110 may include electrically conductive first interconnects 112 extending from surfaces (e.g., bond pads) formed on or otherwise connected to the active side 114 of the first dies 110 before stacking subsequent dies on the first dies 110. The height of the first interconnects 112 may be greater than the height of the stacked dies such that the first interconnects 112 will be exposed during processing of the stacked die structures 100, as will be described in greater detail below. As noted, the first interconnects 112 may be formed as pillars or pins to electrically couple the first dies 110 and other electrical components of the stacked die structures 100.

Figure 2A:
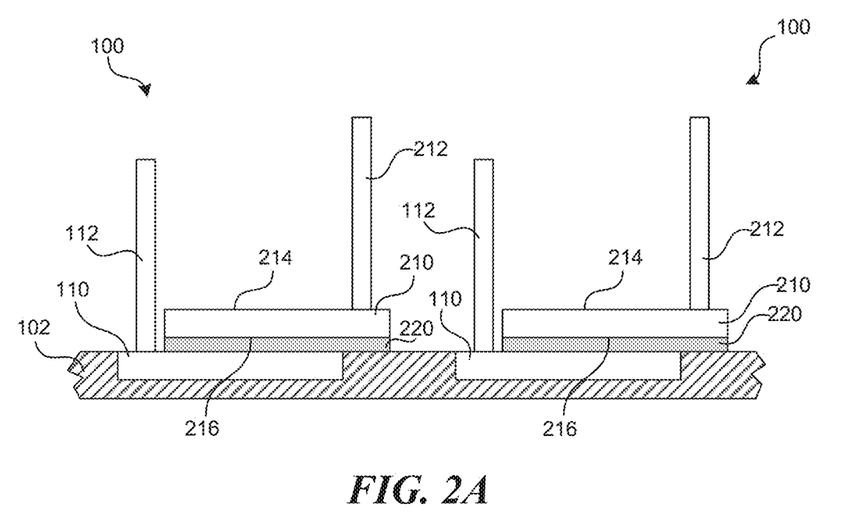
FIG. 2A is an enlarged cross-sectional front elevation view and FIG. 2B is an enlarged cross-sectional plan view showing a second level stage of forming a stacked die structure in accordance with the present technology.
Figure 2B:
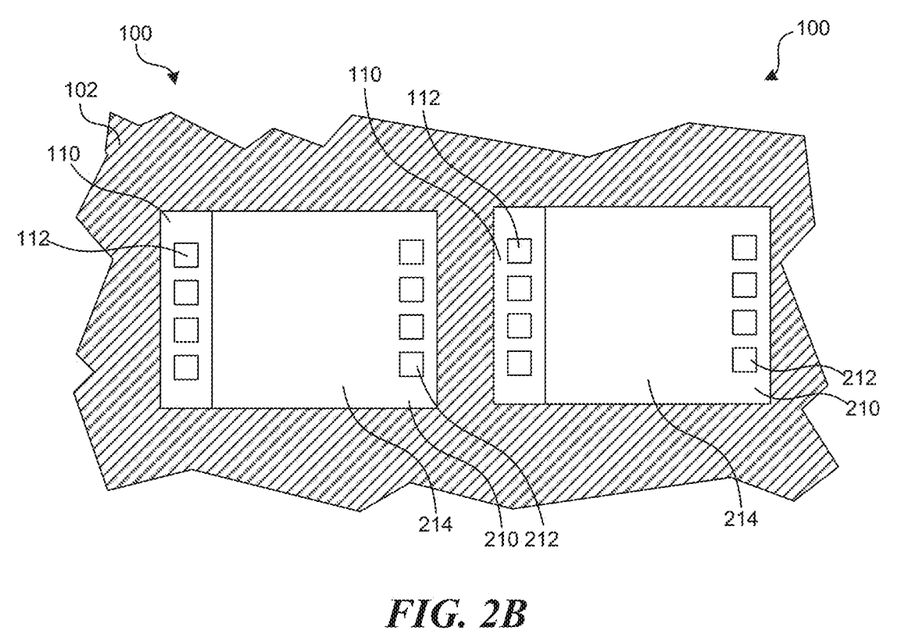

FIGS. 2A and 2B show the stacked die structures 100 with a second level stacked on the primary level. The second level has second dies 210 with an active side 214 and a backside 216. The second level also has electrically conductive second interconnects 212 extending from surfaces (e.g., bond pads) formed on the active side 214 of the second dies 210. The second dies 210 with the second interconnects 212 already attached are stacked on top of the first dies 110 with the first interconnects 112 already attached. The backside 216 of the second dies 210 face the active side 114 of the first dies 110. The second dies 210 can be attached to the first dies 110 and the wafer 102 using a die attach film 220. As shown, the second dies 210 may have an orientation rotated about 180° from the orientation of the first dies 110. In this regard, the second interconnects 212 are positioned near an opposite edge of the stacked die structures 100 from the first interconnects 112. To accommodate the first interconnects 112 that are formed before stacking, the second dies 210 may be shifted laterally with respect to the first dies 110. The degree of the lateral shift may be any suitable offset to provide clearance of the first interconnects 112.

Figure 3A:
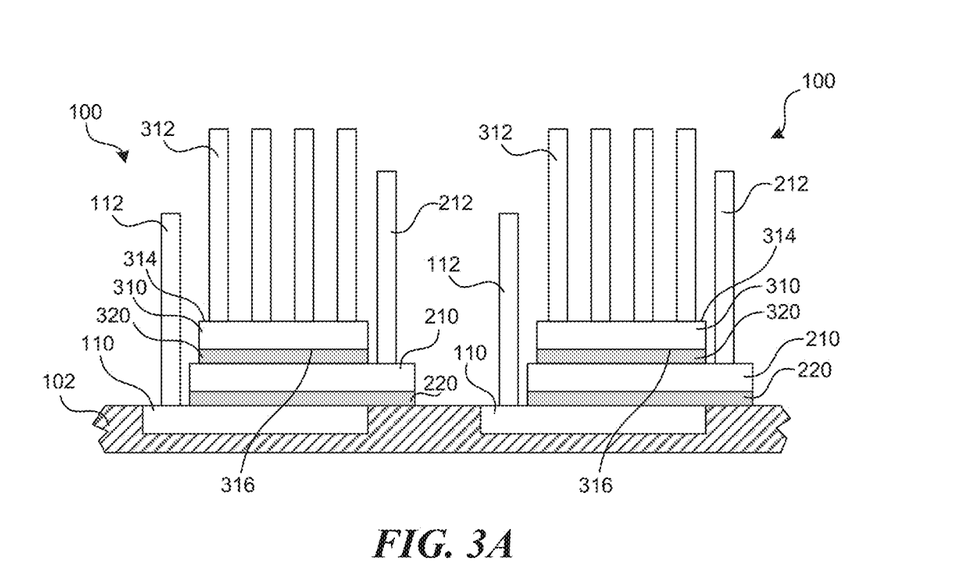
FIG. 3A is an enlarged cross-sectional front elevation view and FIG. 3B is an enlarged cross-sectional plan view showing a third stage of forming a stacked die structure in accordance with the present technology.
Figure 3B:
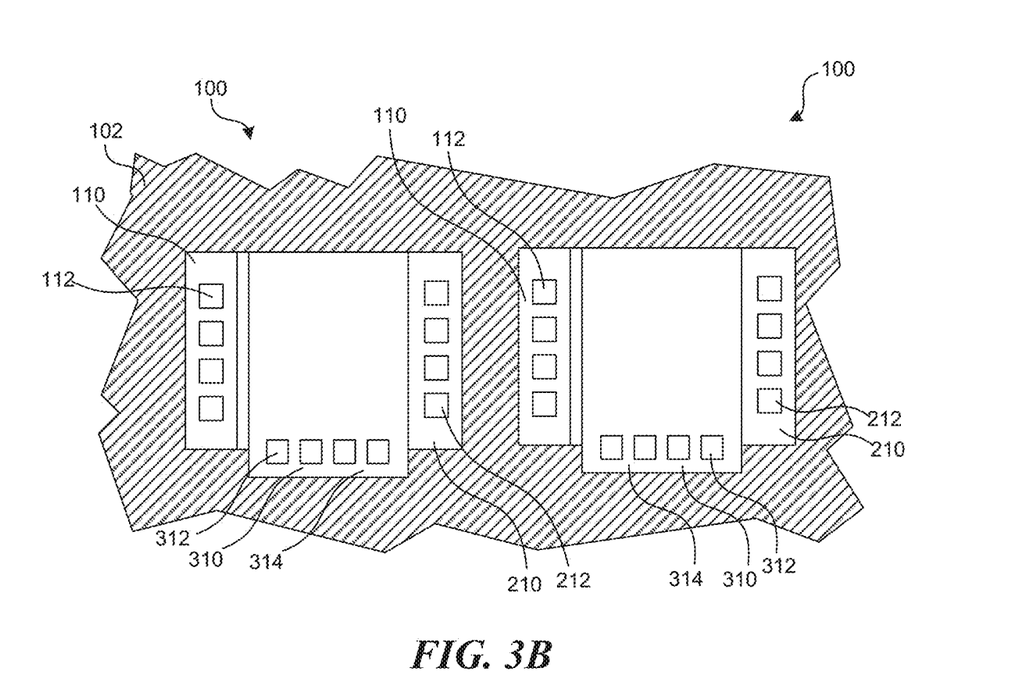

FIGS. 3A and 3B show the stacked die structures 100 with a third level stacked on the second level. The third level has third dies 310 with an active side 314 and a backside 316, and electrically conductive third interconnects 312 extending from surfaces (e.g., bond pads) formed on the active side 314 of the third dies 310. The third dies 310 with the third interconnects 312 already attached are stacked on top of the second dies 210 with the second interconnects 212 already attached. The backside 316 of the third dies 310 face the active side 214 of the second dies 210. The third dies 310 can be attached to the second dies 210 using die attach film 320. As shown, the third dies 310 may have an orientation rotated about 90° from the orientation of the first dies 110 and the second dies 210. In this regard, the third interconnects 312 are positioned near a perpendicular, adjacent edge of the stacked die structures 100 from the first interconnects 112 and the second interconnects 212.

To accommodate extension of the first interconnects 112 and the second interconnects 212 beyond the third dies 310, the third dies 310 may be narrower (e.g., in width) than the first dies 110 and the second dies 210 that are formed prior to stacking. The size of the third dies 310 may be adjusted to provide clearance of the first interconnects 112 and the second interconnects 212 positioned laterally outward from the third dies 310 when assembled to the stacked die structures 100.

Figure 4A:
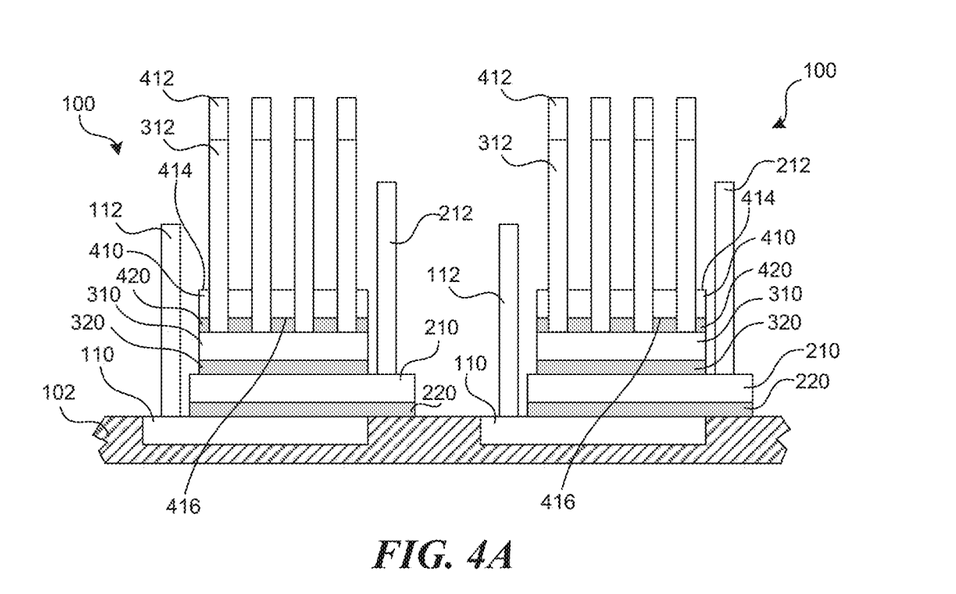
FIG. 4A is an enlarged cross-sectional front elevation view and FIG. 4B is an enlarged cross-sectional plan view a fourth stage of forming a stacked die structure in accordance with the present technology.
Figure 4B:
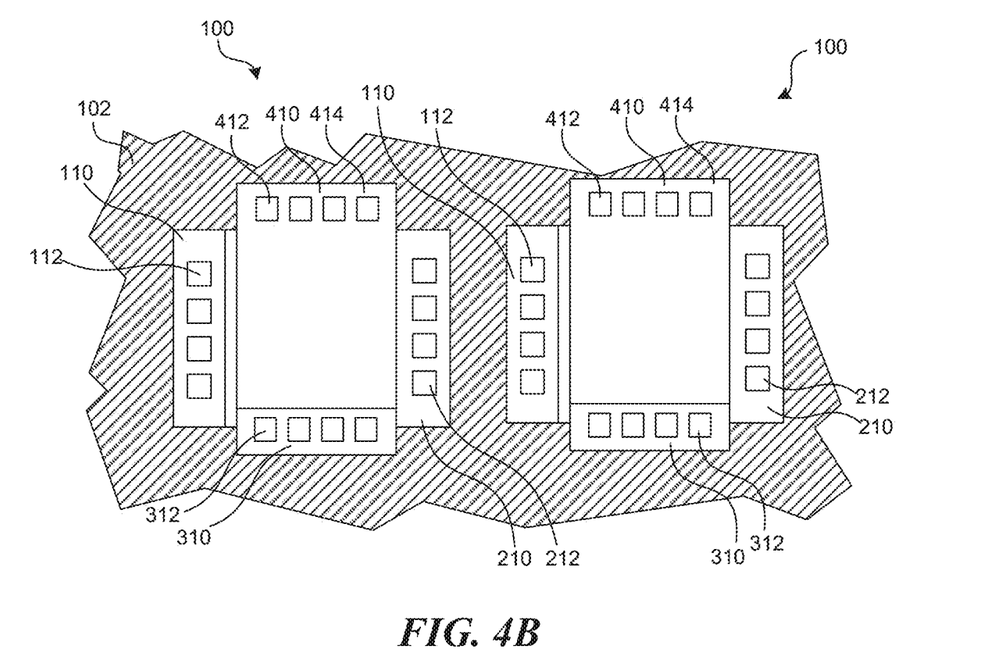

FIGS. 4A and 4B show the stacked die structures 100 after a fourth level is stacked on the third level. The fourth level has fourth dies 410 with an active side 414 and a backside 416, and electrically conductive fourth interconnects 412 extending from surfaces (e.g., bond pads) formed on the active side 414 of the fourth dies 410. The fourth dies 410 with the fourth interconnects 412 already attached are stacked on top of the third dies 310 with the third interconnects 312 already attached. The backside 416 of the fourth dies 410 face the active side 314 of the third dies 310. The fourth dies 410 can be attached to the third dies 310 using die attach film 420. As shown, the fourth dies 410 may have an orientation rotated about 90° from the orientation of the first dies 110 and the second dies 210, and rotated about 180° from the orientation of the third dies 310. In this regard, the fourth interconnects 412 are positioned near a perpendicular, adjacent edge of the stacked die structures 100 from the first interconnects 112 and the second interconnects 212, and an opposite edge from the third interconnects 312.

Similar to the third dies 310, the fourth dies 410 may be narrower (e.g., in width) than the first dies 110 and the second dies 210 to accommodate extension of the first interconnects 112 and the second interconnects 212 beyond the fourth dies 410. The size of the fourth dies 410 may be adjusted to provide clearance of the first interconnects 112 and the second interconnects 212 to be positioned laterally outward from the fourth dies 410 when assembled to the stacked die structures 100. To accommodate the third interconnects 312 that may be formed prior to stacking, the fourth dies 410 may be shifted laterally with respect to the third dies 310. The degree of the lateral shift may be any suitable offset to provide clearance of the third interconnects 312.

Figure 5A:
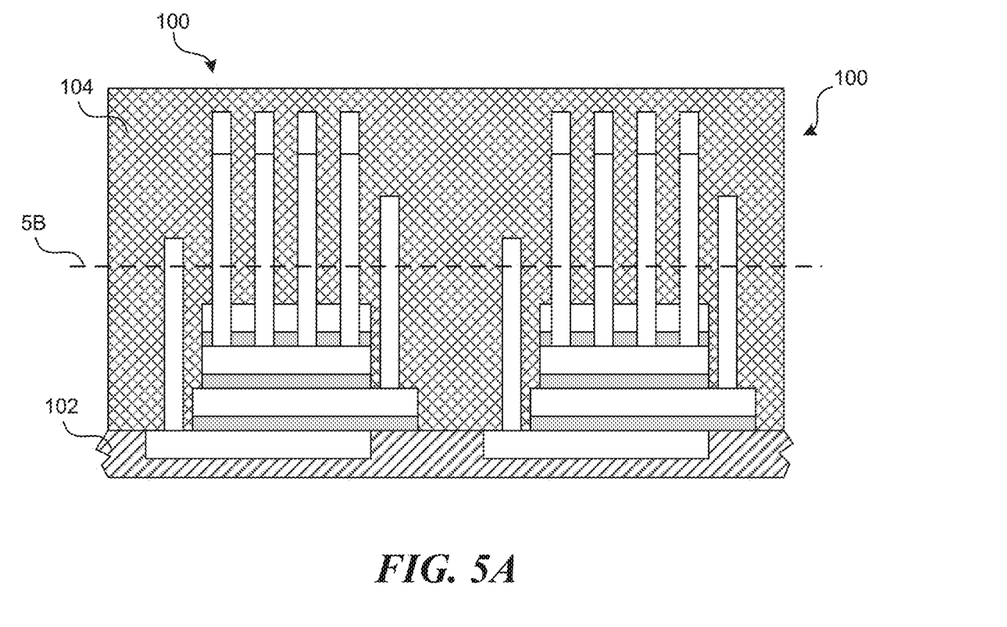
FIGS. 5A-5G are enlarged cross-sectional front elevation views of stages of forming a semiconductor device using the stacked die structure of FIGS. 5A and 5B in accordance with the present technology.

FIGS. 5A-5G show further stages of manufacturing the stacked die structures 100 from the state shown in FIGS. 4A and 4B. For clarity in FIGS. 5A-5G, reference numerals for the primary, second, third, and fourth level dies and interconnect structures, and the corresponding die attach film are not shown. In this regard, the arrangement of the reference numerals for these components in FIGS. 4A and 4B can be inferred in FIGS. 5A-5G, unless otherwise noted. As shown in FIG. 5A, after the dies are assembled, the active sides 114, 214, 314, and 414 all face the same direction and the interconnects 112, 212, 312, and 412 extend from the active sides 114, 214, 314, and 414, respectively, in a common direction. In some embodiments, the interconnects 112, 212, 312, and 412 extend straight (i.e., perpendicular) from the active sides 114, 214, 314, and 414.

The components of the stacked die structures 100 may be covered in a molding material 104 to package and protect the stacked die structures 100. The molding material 104 may be a resin, epoxy resin, silicone-based material, polyimide, and/or any other suitable encapsulant. Once deposited, the molding material 104 can be cured by UV light, chemical hardeners, heat, or other suitable curing methods. In general, the molding material 104 may encapsulate the components of the stacked die structures 100 such the components are sealed within the molding material 104 after curing.

Figure 5B:
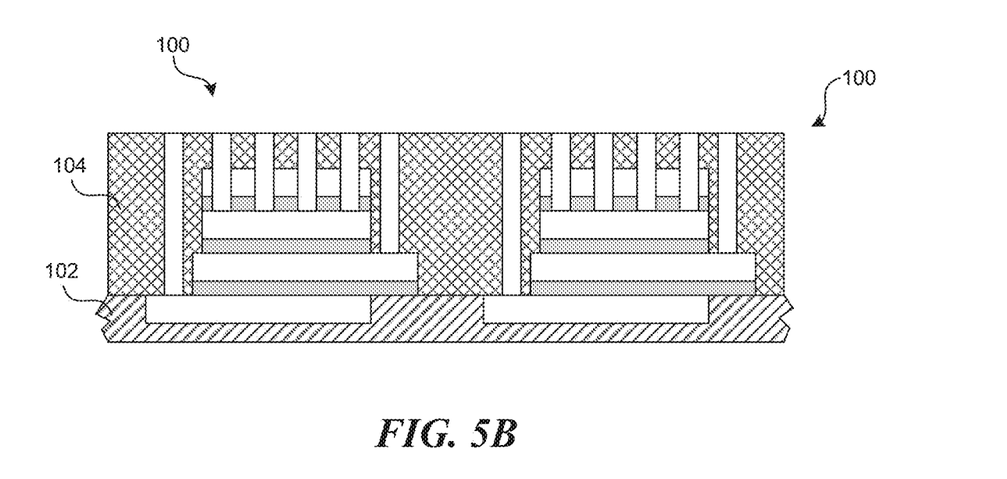

FIG. 5B shows the stacked die structures 100 with a portion of the molding material 104 trimmed and removed to expose one or more of the interconnects of the stacked die structures 100. As shown, at least some of the interconnects may be bisected during the removal step such that the exposed ends of the interconnects are planar. The portion of the molding material 104 may be removed with a grinder, saw, or other tool. In the illustrated embodiment, the molding material 104 is removed along a cut line 5B, shown in FIG. 5A, to expose surfaces of the interconnects of the stacked die structures 100. In other embodiments, the molding material 104 is removed at any location along the height of the stacked die structures 100, and/or is removed in a non-planar configuration.

Figure 5C:
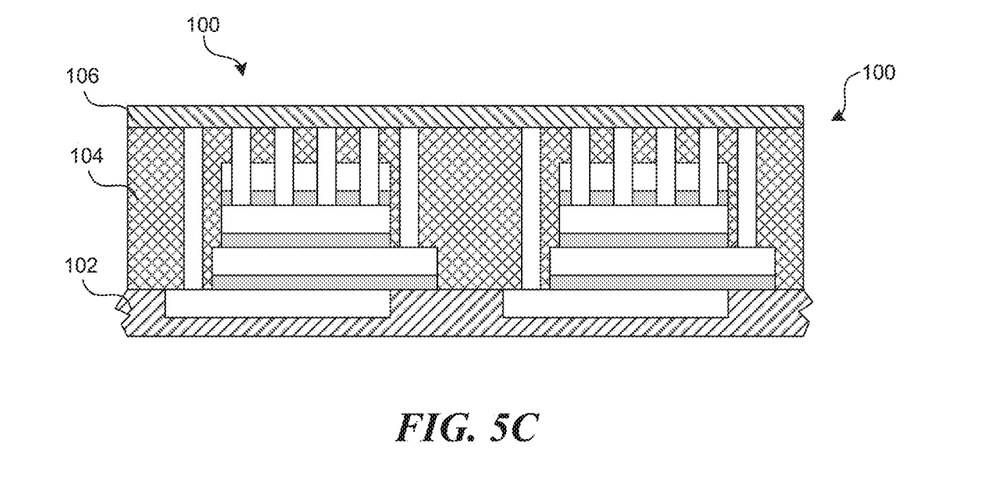

FIG. 5C shows a redistribution layer 106 formed on or otherwise coupled to the surface created when the molding material 104 was removed along the cut line 5B. The redistribution layer 106 is electrically coupled to the interconnect structures 112, 212, 312, and 412 to make the interconnect structures available in other locations on redistribution layer 106 of the stacked die structures 100, to accommodate the layout of a PCB or other component, and/or for improved access to the connections depending on the configuration of the stacked die structures 100. The redistribution layer 106 can have traces, vias, and pads that provide the circuitry to fan out the arrangement of the interconnects to a larger array of pads.

Figure 5D:
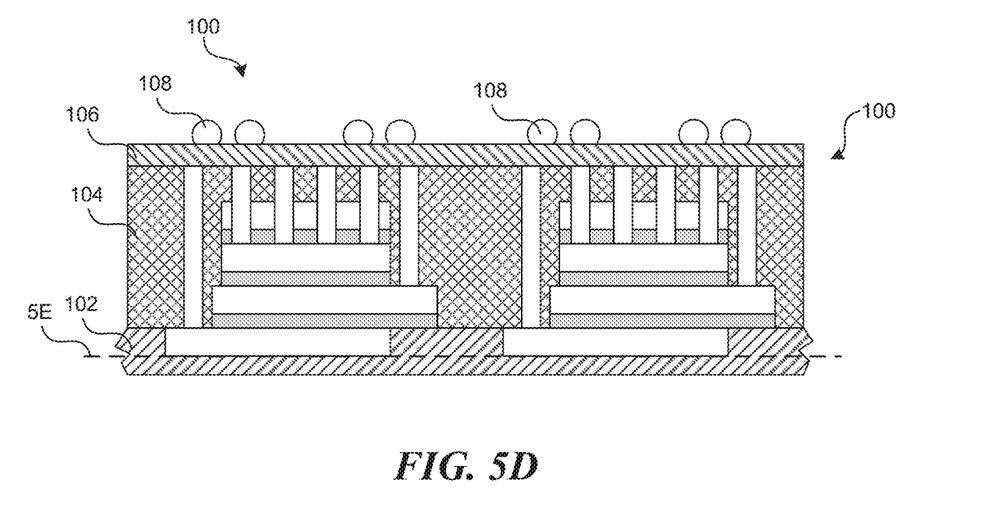

FIG. 5D shows the stacked die structures 100 having connectors 108 to electrically connect the stacked die structures 100 to a PCB or other external component. In some embodiments, the connectors 108 are solder balls coupled to conductive areas (e.g., pads) on the redistribution layer 106. The connectors 108 may be arranged in any location on the redistribution layer 106 depending on the layout of the dies and interconnects of the stacked die structures 100, and/or the configuration of the component on which the stacked die structures 100 will be assembled.

Figure 5E:
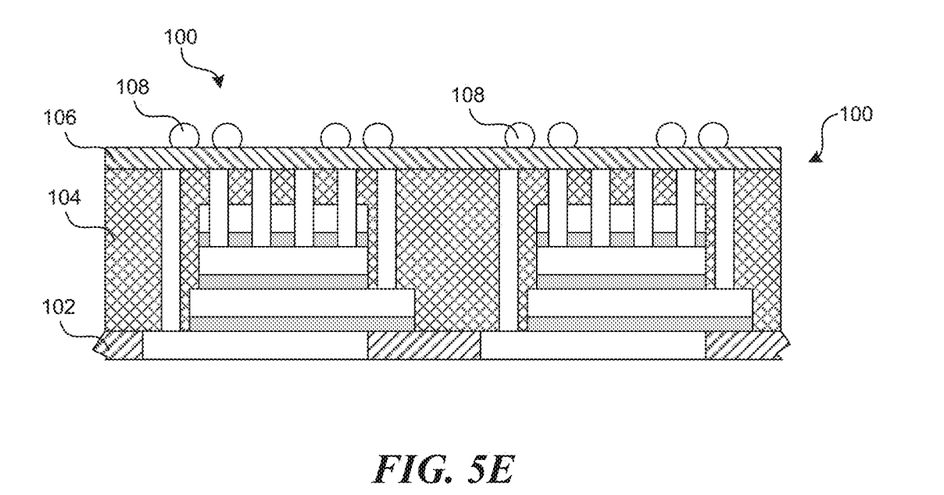

FIG. 5E shows the stacked die structures 100 after a portion of the wafer 102 has been removed along the cut line 5E, shown in FIG. 5D, to further thin the stacked die structures 100. As with the trimming of the molding material 104 in FIG. 5B, a portion of the wafer 102 may be removed using a grinder, saw, or other tool. After thinning the wafer 102, the first dies 110 may have a thickness of less than 50 μm (e.g., ultra thin die thickness). In other embodiments, the first dies 110 have a thickness of 40 μm or less after thinning the wafer 102.

Figure 5F:
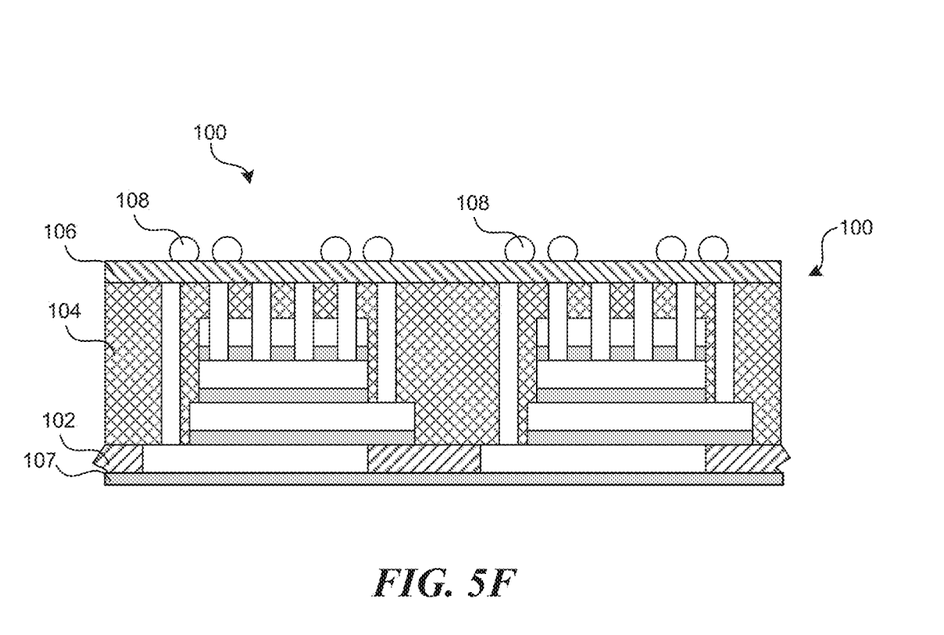

FIG. 5F shows a layer of dicing tape 107 applied to the surface of the stacked die structures 100 created when the portion of the wafer 102 was removed along the cut line 5E. The dicing tape 107 is configured to maintain the arrangement and spacing of the stacked die structures 100 during package separation.

Figure 5G:
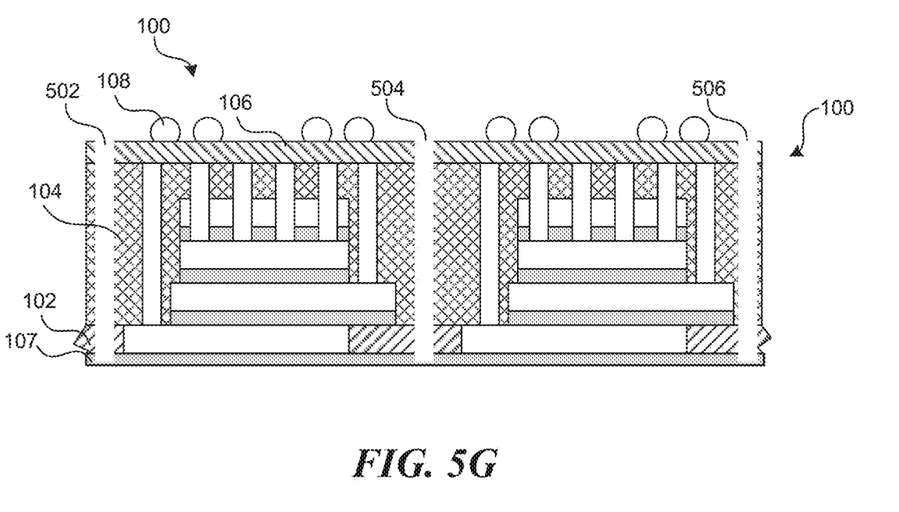

FIG. 5G shows one configuration of separating the packages of the stacked die structures 100. The stacked die structures 100 may be separated along first, second, and third die streets 502, 504, and 506, which cut through the redistribution layer 106, the molding material 104, the wafer 102, and partially into the dicing tape 107. Similar die streets may be arranged in directions parallel to the page and FIG. 5G to surround the packaged stacked die structures 100 for individual removal.

Figure 6:
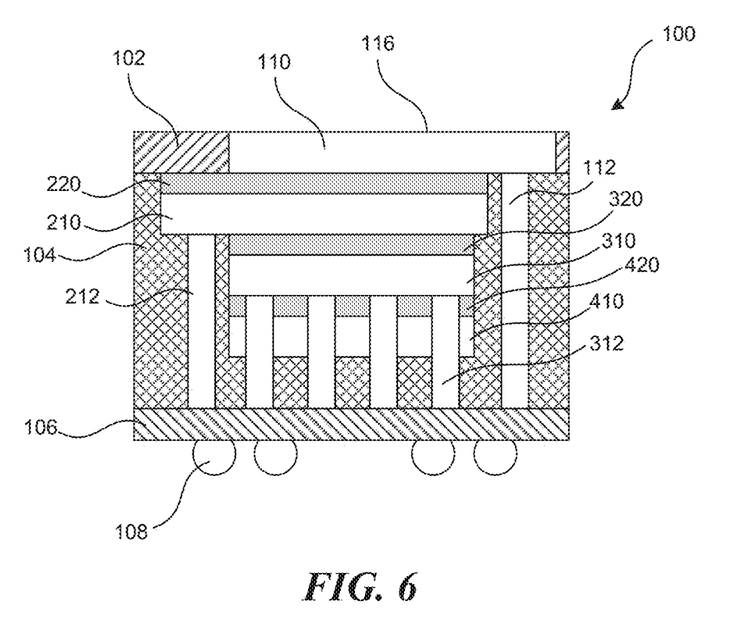
FIG. 6 is an enlarged cross-sectional front elevation view of a semiconductor device in accordance with the present technology.

FIG. 6 shows a completed packaged stacked die structure 100. The stacked die structure 100 is packaged and configured to be electrically connected through the connectors 108 to an external component, such as a PCB. A laser package marking may be applied to the exposed surfaces of the primary level dies a 110 and/or the wafer 102. As shown, a portion of the wafer 102 may remain following the separation of the packages in FIG. 5G, the portion extending laterally from at least one side of the primary level die 110. In embodiments having the extended portion of the wafer 102, the second level die 210 is partially supported by the extended portion. In other embodiments, the primary level die 110 is larger than the second level die 210 to fully support the backside 216 such that an extended portion of the wafer 102 is omitted.

The wafer-level packaging of the present technology is expected to provide several advantages over conventional die stacking techniques using gold wire loops. In some embodiments, the interconnect material is copper, which can improve signal transference compared to gold wire loops. In comparison to conventional die stacking techniques, the present technology omits an interposer or other type of additional substrate to reduce package footprint, height, and cost, among other advantages. In this regard, substrateless stacked die structures of the present technology have a footprint that generally follows the size of the overall footprint of the primary and second level dies in a stacked configuration (e.g., offset laterally as shown herein). In further aspects, a redistribution layer can allow the stacked die structures to make use of fine trace pitch and fine ball pitch configurations. Thermal dissipation is improved via direct exposure of the backside 116 of the first die 110 (in the orientation shown in FIG. 6), opposed to such surfaces residing under molding material. The illustrated embodiments depict several examples of semiconductor devices using the stacked die configurations of the present technology; however, further device configurations having stacked dies are within the scope of the present technology. Forming the interconnects prior to stacking the dies may provide greater manufacturing options (e.g., mask processing techniques) and improved efficiency.

Figure 7:
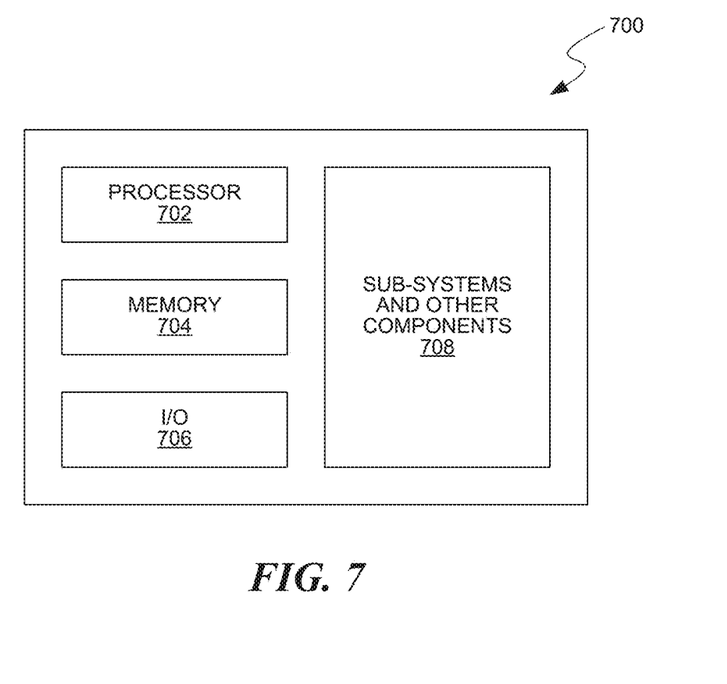
FIG. 7 is a schematic view of a system that includes a semiconductor device configured in accordance with embodiments of the present technology.

FIG. 7 is a block diagram illustrating a system that incorporates a semiconductor device in accordance with embodiments of the present technology. Any one of the semiconductor devices having the features described above with reference to FIGS. 1A-6 can be incorporated into any of a myriad of larger and/or more complex systems, a representative example of which is system 700 shown schematically in FIG. 7. The system 700 can include a processor 702, a memory 704 (e.g., SRAM, DRAM, flash, and/or other memory devices), input/output devices 706, and/or other subsystems or components 708. The semiconductor assemblies, devices, and device packages described above with reference to FIGS. 1A-6 can be included in any of the elements shown in FIG. 7. The resulting system 700 can be configured to perform any of a wide variety of suitable computing, processing, storage, sensing, imaging, and/or other functions. Accordingly, representative examples of the system 700 include, without limitation, computers and/or other data processors, such as desktop computers, laptop computers, Internet appliances, hand-held devices (e.g., palm-top computers, wearable computers, cellular or mobile phones, personal digital assistants, music players, etc.), tablets, multi-processor systems, processor-based or programmable consumer electronics, network computers, and minicomputers. Additional representative examples of the system 700 include lights, cameras, vehicles, etc. In these and other examples, the system 700 can be housed in a single unit or distributed over multiple interconnected units, e.g., through a communication network. The components of the system 700 can accordingly include local and/or remote memory storage devices and any of a wide variety of suitable computer-readable media.

As used in the foregoing description, the terms "vertical," "lateral," "upper," and "lower" can refer to relative directions or positions of features in the semiconductor devices in view of the orientation shown in the Figures. For example, "upper" or "uppermost" can refer to a feature positioned closer to the top of a page than another feature. These terms, however, should be construed broadly to include semiconductor devices having other orientations, such as inverted or inclined orientations where top/bottom, over/under, above/below, up/down, left/right, and distal/proximate can be interchanged depending on the orientation. Moreover, for ease of reference, identical reference numbers are used to identify similar or analogous components or features throughout this disclosure, but the use of the same reference number does not imply that the features should be construed to be identical. Indeed, in many examples described herein, identically numbered features have a plurality of embodiments that are distinct in structure and/or function from each other. Furthermore, the same shading may be used to indicate materials in cross section that can be compositionally similar, but the use of the same shading does not imply that the materials should be construed to be identical unless specifically noted herein.

The foregoing disclosure may also reference quantities and numbers. Unless specifically stated, such quantities and numbers are not to be considered restrictive, but exemplary of the possible quantities or numbers associated with the new technology. Also, in this regard, the present disclosure may use the term "plurality" to reference a quantity or number. In this regard, the term "plurality" is meant to be any number that is more than one, for example, two, three, four, five, etc. For the purposes of the present disclosure, the phrase "at least one of A, B, and C," for example, means (A), (B), (C), (A and B), (A and C), (B and C), or (A, B, and C), including all further possible permutations when greater than three elements are listed.

From the foregoing, it will be appreciated that specific embodiments of the new technology have been described herein for purposes of illustration, but that various modifications may be made without deviating from the present disclosure. Accordingly, the invention is not limited except as by the appended claims. Furthermore, certain aspects of the new technology described in the context of particular embodiments may also be combined or eliminated in other embodiments. Moreover, although advantages associated with certain embodiments of the new technology have been described in the context of those embodiments, other embodiments may also exhibit such advantages and not all embodiments need necessarily exhibit such advantages to fall within the scope of the present disclosure. Accordingly, the present disclosure and associated technology can encompass other embodiments not expressly shown or described herein.

I claim:

1. A method of assembling a semiconductor device, the method comprising:
   forming a first die in a semiconductor wafer, the first die having a backside and an active side opposite the backside;
   connecting a conductive first interconnect to a first peripheral edge region of the active side of the first die;

connecting a conductive second interconnect to a second peripheral edge region of an active side of a second die, wherein the second die has a backside opposite the active side of the second die;

connecting a conductive third interconnect to a third peripheral edge region of an active side of a third die, wherein the third die has a backside opposite the active side of the third die; and after connecting the first through third interconnect to the first through third dies, respectively, mounting the second die to the first die such that the second peripheral edge region of the second die overhangs a first edge of the first die opposite the first peripheral edge region; and mounting the third die to the second die such that the third peripheral edge region of the third die overhangs a second edge of the first die which is perpendicular to the first edge, wherein the first interconnect, the second interconnect, and the third interconnect all have a same vertical height.

2. The method of claim 1, further comprising:
applying a molding material at least partially surrounding the second die and the first and second interconnects;
curing the molding material; and
trimming a surface of the molding material to at least partially expose the first and second interconnects.

3. The method of claim 2, further comprising:
mounting a redistribution layer to the trimmed surface of the molding material; and
electrically connecting the first and second interconnects to the redistribution layer.

4. The method of claim 1, wherein the third interconnect extends in a direction of the first and second interconnects.

5. The method of claim 4, wherein, when assembled, the third interconnect is positioned near a third edge of the semiconductor device between the first and second edges.

6. The method of claim 5, further comprising:
connecting a conductive fourth interconnect to an active side of a fourth die, wherein the fourth die has a backside opposite the active side of the fourth die;
mounting the backside of the fourth die to the active side of the third die after connecting the fourth interconnects to the fourth die such that the first, second, and third interconnects extend beyond the active side of the fourth die, wherein the fourth interconnect extends in a direction of the first, second, and third interconnects.

7. The method of claim 6, wherein, when assembled, the fourth interconnect is positioned near a fourth edge of the semiconductor device between the first and second edges and opposite the third edge.

8. The method of claim 4, wherein:
the first die has a first die width;
the second die has a second die width equal to the first die width; and
the third die has a third die width that is less than a width of the first and second dies such that the first and second interconnects extend beyond the active side of the mounted third die.

9. The method of claim 8, wherein the second die is rotated about 180° relative to the first die, and wherein the third die is rotated about 90° relative to the second die.

10. The method of claim 6, wherein:
the first die has a first die width;
the second die has a second die width equal to the first die width;
the third die has a third die width that is less than a width of the first and second dies; and
the fourth die has a fourth die width equal to the third die width.

11. The method of claim 8, wherein:
the second die is rotated about 180° relative to the first die;
the third die is rotated about 90° relative to the second die; and
the fourth die is rotated about 180° relative to the third die.

12. The method of claim 1, wherein the first die has a first die width and the second die has a second die width equal to the first die width.

13. The method of claim 12, wherein mounting the backside of the second die to the active side of the first die further comprises aligning the first die width with the second die width.

14. The method of claim 13, wherein the second die is rotated about 180° relative to the first die.

15. The method of claim 14, wherein the second die is positioned laterally offset from the first die such that the first interconnect extends beyond the active side of the second die.

* * * * *